(12) United States Patent
Fitzgerald et al.

(10) Patent No.: US 8,187,379 B2
(45) Date of Patent: *May 29, 2012

(54) METHOD OF PRODUCING HIGH QUALITY RELAXED SILICON GERMANIUM LAYERS

(75) Inventors: Eugene Fitzgerald, Windham, NH (US); Richard Westhoff, Hudson, NH (US); Matthew T. Currie, Brookline, MA (US); Christopher J. Vineis, Cambridge, MA (US); Thomas A. Langdo, Cambridge, MA (US)

(73) Assignee: Taiwan Semiconductor Manufacturing Company, Ltd., Hsin-Chu ( * ) Notice: Subject to any disclaimer, the term of this patent is extended or adjusted under 35 U.S.C. 154(b) by 0 days.

This patent is subject to a terminal disclaimer.

(21) Appl. No.: 13/074,777

(22) Filed: Mar. 29, 2011

(65) Prior Publication Data

US 2011/0177681 A1 Jul. 21, 2011

Related U.S. Application Data

(63) Continuation of application No. 12/711,560, filed on Feb. 24, 2010, now Pat. No. 7,955,435, which is a continuation of application No. 11/371,442, filed on Mar. 9, 2006, now Pat. No. 7,674,335, which is a continuation of application No. 10/392,338, filed on Mar. 19, 2003, now Pat. No. 7,041,170, which is a continuation-in-part of application No. 09/665,139, filed on Sep. 19, 2000, now abandoned.

(60) Provisional application No. 60/154,851, filed on Sep. 20, 1999.

(51) Int. Cl.
*C30B 21/02* (2006.01)

(52) U.S. Cl. .................. 117/86; 117/90; 117/94

(58) Field of Classification Search .................... 117/86, 117/90, 94, 96, 101
See application file for complete search history.

(56) References Cited

U.S. PATENT DOCUMENTS

| | | | | |
|---|---|---|---|---|
| 7,041,170 B2 * | 5/2006 | Fitzgerald et al. | ............... | 117/89 |
| 7,671,335 B2 * | 3/2010 | Nishikawa et al. | ........ | 250/338.4 |
| 7,955,435 B2 * | 6/2011 | Fitzgerald et al. | ............... | 117/86 |

* cited by examiner

*Primary Examiner* — Bob M Kunemund
(74) *Attorney, Agent, or Firm* — Slater & Matsil, L.L.P.

(57) ABSTRACT

A method for minimizing particle generation during deposition of a graded $Si_{1-x}Ge_x$ layer on a semiconductor material includes providing a substrate in an atmosphere including a Si precursor and a Ge precursor, wherein the Ge precursor has a decomposition temperature greater than germane, and depositing the graded $Si_{1-x}Ge_x$ layer having a final Ge content of greater than about 0.15 and a particle density of less than about 0.3 particles/cm² on the substrate.

20 Claims, 6 Drawing Sheets

| Si PRECURSOR | DECOMPOSITION TEMPERATURE (C°) | Ge PRECURSOR | DECOMPOSITION TEMPERATURE (C°) |
|---|---|---|---|
| $SiH_4$ | 900 | $GeH_4$ | 675 |
| $SiH_2Cl_2$ | 950 | $GeH_2Cl_2$ | 725 |
| $SiHCl_3$ | 1000 | $GeHCl_3$ | 775 |
| $SiCl_4$ | 1150 | $GeCl_4$ | 925 |

| Si PRECURSOR | ACHIEVABLE Si GROWTH RATE (microns/min) | Ge PRECURSOR | ACHIEVABLE $Si_{0.8}Ge_{0.2}$ GROWTH RATE (microns/min) |
|---|---|---|---|
| $SiH_4$ | 0.3 | $GeCl_4$ | 0.4 |
| $SiH_2Cl_2$ | 1.2 | $GeCl_4$ | 1.1 |
| $SiHCl_3$ | 5.0 | $GeCl_4$ | 3.8 |
| $SiCl_4$ | 5.0 | $GeCl_4$ | 3.8 |

METHOD OF PRODUCING HIGH QUALITY RELAXED SILICON GERMANIUM LAYERS

This application is a continuation of U.S. patent application Ser. No. 12/711,560, filed on Feb. 24, 2010, entitled "Method of Producing High Quality Relaxed Silicon Germanium Layers," which is a continuation of U.S. patent application Ser. No. 11/371,442, filed Mar. 9, 2006, entitled "Method of Producing High Quality Relaxed Silicon Germanium Layers," now U.S. Pat. No. 7,674,335, which is a continuation of U.S. patent application Ser. No. 10/392,338, filed Mar. 19, 2003, entitled "Method of Producing High Quality Relaxed Silicon Germanium Layers," now U.S. Pat. No. 7,041,170, which is a continuation-in-part of U.S. patent application Ser. No. 09/665,139, filed Sep. 19, 2000, entitled "Method of Producing Relaxed Silicon Germanium Layers," which claims the benefit of U.S. Provisional Patent Application Ser. No. 60/154,851, filed Sep. 20, 1999, entitled "Method of Producing High Quality Relaxed Silicon Germanium Layers;" all of the foregoing applications are hereby incorporated by reference in their entireties.

TECHNICAL FIELD

This invention relates generally to producing silicon germanium layers and more particularly to producing high quality silicon germanium layers.

BACKGROUND

Conventional techniques for producing relaxed silicon germanium (SiGe) layers on Si substrates typically consist of flowing germane ($GeH_4$) and a silicon precursor, such as silane ($SiH_4$) or dichlorosilane ($SiH_2Cl_2$), across a hot semiconductor substrate. When the temperature of these precursors reaches their respective decomposition temperatures, the precursors break down and Si and Ge atoms are free to deposit on the heated substrate. If the substrate is maintained at a sufficiently high temperature, thin-film crystal growth proceeds.

Commercialization of this method to produce relaxed SiGe layers on semiconductor substrates for use in optoelectronic and electronic devices demands an economical process of forming high quality SiGe layers. This means that production costs, such as equipment costs and production time must be minimized, while at the same time, the material properties of the SiGe layers produced must be tailored or optimized for their specific purpose.

Under most conditions, chemical vapor deposition (CVD) processes provide the most economical method of depositing thin layers of crystalline semiconductors. For example, in general, CVD equipment costs are much lower than corresponding equipment costs required to produce the same thin layer product using molecular beam epitaxy (MBE) techniques. Further, high thin-film growth rates can be achieved using CVD. These high growth rates (i.e. greater than 0.1 microns/minute) are essential in producing economical relaxed SiGe materials, since high growth rates reduce deposition time, thereby maximizing production rate and lowering the cost of the product.

While it is important to keep production costs low, it is equally important to produce high quality SiGe layers that possess the appropriate material properties for use in optoelectronic and electronic devices. High quality SiGe films have a low particle defect density (i.e. less than 0.3 particles/$cm^2$) and a low threading dislocation density (i.e. less than $10^6/cm^2$). If the produced SiGe layers do not achieve this level of quality, the electronic properties of the layers will not be suitable for use in optoelectronic and electronic devices.

Therefore, commercial production of high quality relaxed SiGe layers depends on the following three criteria:

A high growth rate is needed so that deposition time is minimized and production rate is maximized, thereby reducing costs of producing SiGe layers. An increase in growth rate is typically achieved by increasing the substrate temperature and precursor gas concentration.

The deposited SiGe layer has a low threading dislocation density, so that the deposited SiGe layer is of high quality. A decrease in threading dislocation density is typically achieved by increasing the deposition temperature.

The deposited SiGe layer has a low particle defect density to produce a high quality SiGe layer. A major source of particle defects during epitaxial deposition is flaking of deposits on a reactor wall. Therefore a decrease in reactor wall coating buildup generally decreases the number of particles that subsequently deposit on the SiGe layers.

One of the problems encountered when trying to extend conventional research methods of producing SiGe layers to a commercially viable process is that efforts to increase the growth rate and decrease the threading dislocation density also increase the particle defect density. This occurs because an increase in deposition temperature and an increase in precursor concentration leads to particle defects nucleating and depositing on the substrates and to an increase in coating buildup on the reactor walls, which eventually leads to flaking of the coating during growth of the SiGe layers.

This problem is exacerbated by the use of germane gas as a precursor. Germane decomposes at a much lower temperature, 675° C., than its silicon precursor counterpart (i.e. 900° C. for silane gas and 950° C. for dichlorosilane). Thus, any increase in deposition temperature increases the amount of Ge atoms available for deposition and thus increases deposits on reactor walls and particle defects on the substrate. The result of high temperature growth with germane is the formation of a brown or black, partially opaque coating on an inner surface of the reactor. In the case of a typical lamp-heated production CVD reactor, this coating limits the transmission of radiated energy from the lamps through the quartz reactor wall to the substrate. The loss of transmissivity of the reactor, which is typically a quartz tube, causes the inner surface of the reactor to heat to a temperature above 700° C., resulting in further deposits. Eventually, if left unchecked, the temperature of the reactor wall will reach 1000° C., at which point devitrification occurs. Both the reactor coating and devitrification can flake from the reactor walls and deposit on the substrate.

Most applications for relaxed $Si_{1-x}Ge_x$ layers require an atomic Ge content above about 15% (x=0.15). In order to increase the Ge content in the layer, the precursor concentration of germane must be increased, thereby increasing particle defect generation.

Thus, it would be desirable to develop a method of producing relaxed SiGe layers on a semiconductor substrate that minimizes particle defect generation during deposition of SiGe layers, especially for high-Ge-content SiGe layers.

SUMMARY OF THE INVENTION

One solution to this problem is to change the gas chemistry such that deposition on the reactor walls is reduced, especially when producing $Si_{1-x}Ge_x$ layers having a x value greater than 0.15. Thus, it is desirable to use a germanium precursor that decomposes at higher temperature.

Since the main problem in SiGe film growth is the low decomposition temperature of the germane gas, the present invention uses a germanium precursor having a higher decomposition temperature than germane, such as a germanium-halide. In this way, the decomposition temperatures of the precursors can be optimally chosen such that very high growth rates can be achieved at high growth temperatures, yet excessive reactor coating and particle defect introduction can be kept to a minimum.

Germanium halides include germanium-chlorine-containing species such as $GeCl_4$, or $GeHCl_3$, or $GeH_2Cl_2$, germanium-fluorine containing species, such as $GeF_4$, as well as germanium-bromine-containing species, such as $GeBr_4$, germanium-iodine-containing species, such as $GeI_4$, and germanium-astatine containing species, such as $GeAt_4$. In addition, any other combinations of these halides with germanium, such as $GeClBr_3$ or more generally a germanium-halide$(1)_x$-halide$(2)_y$, where $x+y=4$, that have a higher decomposition temperature than germane may be used as a germanium precursor. These precursors can, unlike germane, be used at growth temperatures in excess of 800° C. to grow thick, relaxed SiGe layers without excessive reactor wall coating and particle defect formation. They can be utilized in gaseous form or in liquid form. In the case of a liquid precursor, a hydrogen carrier gas is typically bubbled through the liquid, and vapor from the liquid is carried into the reactor. Thus, typically the precursor will be in gaseous form inside the reactor. The germanium halide precursors can be combined with any of the typical silicon precursors, such as $SiH_4$, $SiH_2Cl_2$, $SiHCl_3$, $SiHCl_4$. Another advantage of this approach is that higher growth temperatures lead to lower threading dislocation densities in the relaxed graded layer. Thus, incorporating a different precursor for germanium leads to a lower defect density in the relaxed SiGe layers.

In general, in one aspect, the invention features a method for minimizing particle defect generation during deposition of a graded $Si_{1-x}Ge_x$ layer on a semiconductor material. The method includes providing a substrate in an atmosphere including a Si precursor and a Ge precursor, wherein the Ge precursor has a higher decomposition temperature than germane (e.g., a germanium halide), and depositing a graded $Si_{1-x}Ge_x$ layer having a final Ge content of greater than about 0.15 and a particle density of less than about 0.3 particles/$cm^2$ on the substrate.

Embodiments of this aspect of the invention include depositing the graded $Si_{1-x}Ge_x$ layer at a temperature greater than about 600° C. In some embodiments, the $Si_{1-x}Ge_x$ layer is deposited at a temperature greater than 800° C. In still yet other embodiments, the $Si_{1-x}Ge_x$ layer is deposited at a temperature greater than 1000° C., and is preferably deposited at a temperature of 1100° C. In other embodiments, the graded $Si_{1-x}Ge_x$ layer has a final Ge content of greater than 0.2, i.e. $x>0.2$. In another embodiment, the final Ge content is substantially equal to 1.0. The deposited $Si_{1-x}Ge_x$ layers formed using the above method are grown with a deposition rate in excess of 0.3 microns/minute and under certain growth conditions, the deposition rate can exceed 3.0 microns/minute. In another embodiment, a low energy plasma, such as that produced by a direct current (DC) arc discharge is utilized in the reactor to enhance the reaction kinetics and hence the growth rate of the $Si_{1-x}Ge_x$ layer. Gases such as Ar or $H_2$ can be used to facilitate the low energy plasma discharge. Low energy plasma rectors useful in carrying out the present invention include the CLUSTERLINE® LEP, manufactured by Unaxis, having corporate headquarters in Pfäffikon, Switzerland.

In another aspect, the invention features a method for minimizing particle defect generation during deposition of a graded $Si_{1-x}Ge_x$ layer on a semiconductor material, wherein the reverse of the deposition or etching reaction removes unwanted deposits from the reactor chamber walls while the decomposition is in progress. The method includes providing a substrate in an atmosphere comprising a Si precursor, a Ge precursor, and an etchant gas. Removal of unwanted deposits on the reactor walls occurs because the halide etchant species (e.g., HCl produced from the decomposition of $GeCl_4$) is introduced as a byproduct of the decomposition of the silicon or germanium halide species. In addition, the hydrogen halides produce much higher etch rates than hydrogen species alone. Alternatively, the etchant gas (e.g., HCl, HBr, HF, or HI or a halide alone $Cl_2$, $Br_2$, $F_2$, or $I_2$) can be co-injected or introduced (i.e. etchant gas is present during at least some part of SiGe deposition) to reduce the accumulation of unwanted deposits on the reactor chamber walls.

In another aspect, the invention features a semiconductor material formed using the method as described above. The semiconductor material can be commercially produced because it is formed at high temperatures and deposition rates and because the material is of high quality, that is it has a defect level of less than about 0.3 particles/$cm^2$ and has a threading dislocation density of less than about $1 \times 10^6/cm^2$.

In another aspect, the invention features a method including the steps of providing a substrate in an atmosphere of $SiH_2Cl_2$ and $GeCl_4$ and depositing a $Si_{1-x}Ge_x$ layer on the substrate. The deposited $Si_{1-x}Ge_x$ layer has a x value greater than or equal to 0.02 and a particle density of less than about 0.3 particles/$cm^2$.

BRIEF DESCRIPTION OF THE DRAWINGS

The invention, in accordance with preferred and exemplary embodiments, together with further advantages thereof, is more particularly described in the following detailed description, taken in conjunction with the accompanying drawings.

In the drawings, like reference characters generally refer to the same parts throughout the different views. Also, the drawings are not necessarily to scale, emphasis instead generally being placed upon illustrating principles of the invention.

DETAILED DESCRIPTION OF ILLUSTRATIVE EMBODIMENTS

Figure 1:
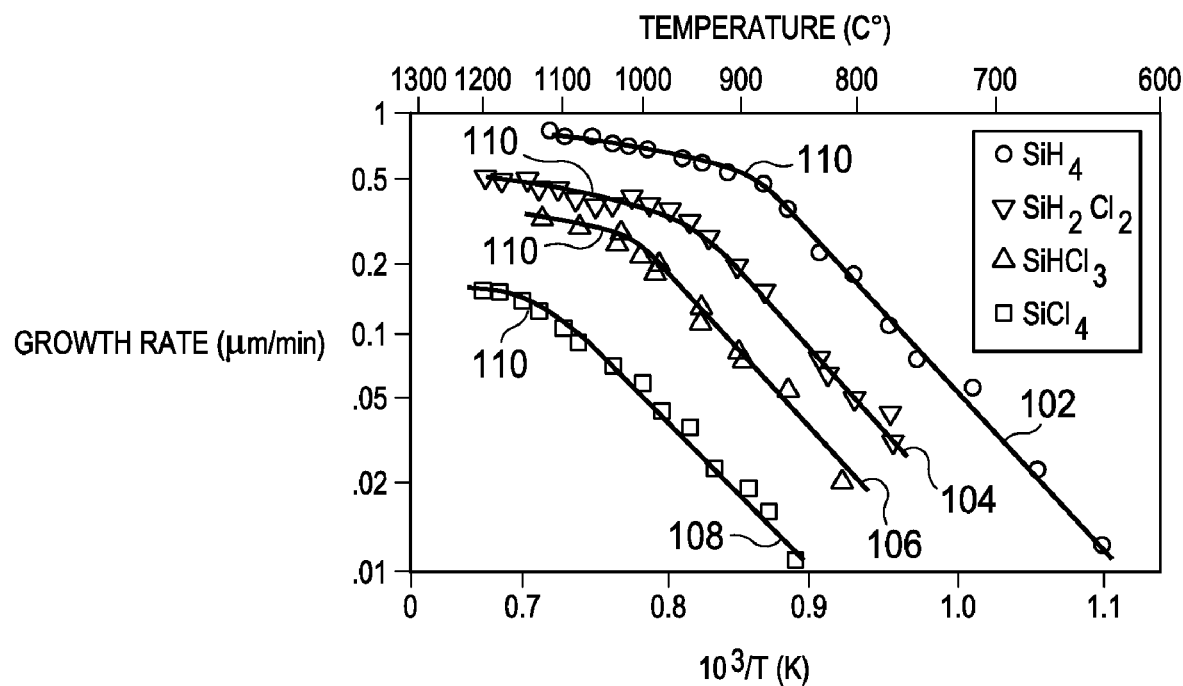
FIG. 1 shows an Arrhenius plot of silicon growth rate versus temperature for $SiH_4$, $SiH_2Cl_2$, $SiHCl_3$, and $SiCl_4$.

FIG. 1 is a graph showing the growth rate of silicon versus temperature for various silicon precursors, $SiH_4$ 102, $SiH_2Cl_2$ 104, $SiHCl_3$ 106, and $SiCl_4$ 108. Two distinct growth regimes are evident. For low temperatures, the growth rate has an exponential dependence on temperature, indicating that the growth is reaction rate or kinetically limited. For high temperatures, the growth rate has a weak dependence on temperature, indicating that the growth is mass-transport or diffusion-limited. Epitaxial layers are typically formed in the mass-transport limited-regime to minimize the effects of temperature variations during growth.

In between the two distinct growth regimes shown in FIG. 1 is a transition point 110. The temperature corresponding to the transition point for each precursor 102, 104, 106, and 108 is the decomposition temperature, or the temperature at which the precursor is nearly completely decomposed.

It is well known that as more hydrogen atoms in the $SiH_4$ molecule are replaced with chlorine atoms, the decomposition temperature of the precursor increases. This effect is reflected in the shift of the reaction-limited regime to higher temperatures for precursors with increasing chlorine content. For example, the mass-transport-limited growth regime of $SiCl_4$ 108 is shifted over 200° C. toward a higher temperature compared to that of $SiH_4$ 102. As a result, epitaxial films can be grown with $SiCl_4$ at much higher temperatures than with $SiH_4$ while avoiding the effects of particle defect formation and reactor wall coating. Additionally, extremely high growth rates can be achieved at higher temperatures using these chlorine-based precursor chemistries.

It is also known for silicon precursors that as the pressure at which deposition is carried out is changed from atmospheric to reduced pressure, chamber coating tends to increase. This is supported by the chemical equations for decomposition reactions, which have a larger number of moles of gaseous product than of reactants. This characteristic of the decomposition reactions (larger volume of reactants than products) favors the forward reaction, i.e. formation reaction, at lower pressure. Thus the decomposition temperature of the precursors will generally be lower at reduced pressures, a characteristic that can be extended to the germanium precursors as well. For this reason, atmospheric pressure deposition may be preferred to reduce chamber coating.

Since the main problem with conventional techniques of depositing SiGe layers is the low decomposition temperature of the germane gas, the present invention uses any germanium precursor that has a higher decomposition temperature than germane, such as a germanium-halide precursor. As in the silicon system, chlorogermanes and other germanium halides can be used to extend growth temperatures to more than 200° C. over germane, $GeH_4$, growth temperatures without increasing particle defect deposition.

Figure 2A:
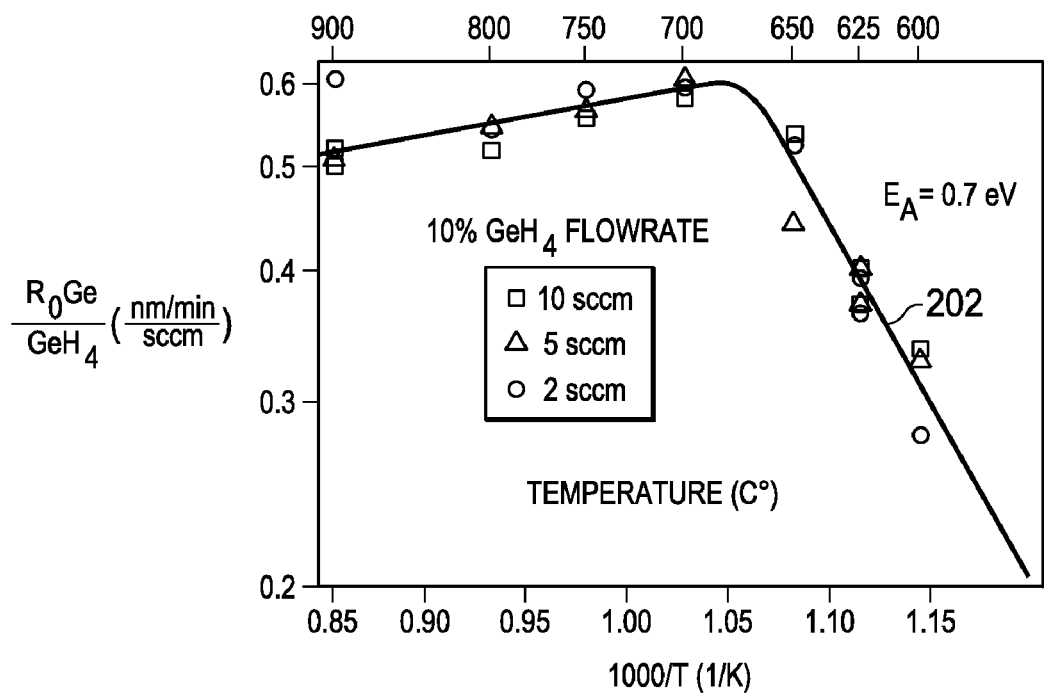
FIG. 2a shows an Arrhenius plot of normalized germanium growth rate in SiGe versus temperature for $GeH_4$.
Figures 2B, 2C:
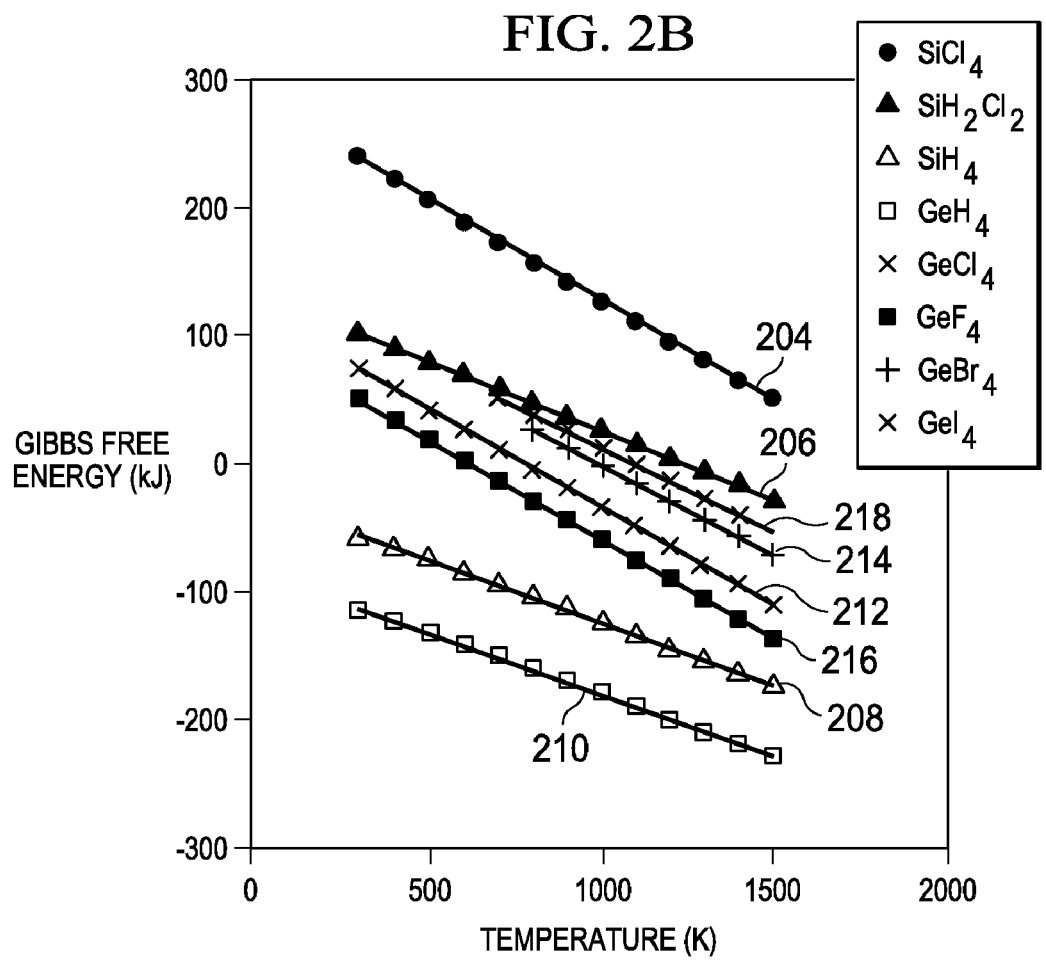
FIG. 2b shows a graph of calculated Gibbs free energy of reaction versus temperature for several Si and Ge precursors.
FIG. 2c shows a table of decomposition temperatures for several silicon precursors and germanium precursors.

FIG. 2a shows a graph of temperature versus normalized growth rate of Ge in SiGe for a conventional Ge precursor, $GeH_4$ 202. Using FIG. 2a, FIG. 2b, a graph of calculated Gibbs free energy of reaction versus temperature for several Si and Ge precursors, and FIG. 1, which shows that the decomposition temperature increases with increasing the chlorine (halide) content, it is expected that the decomposition temperature of any germanium halide precursor will be significantly higher than germane, $GeH_4$. For example, FIG. 1 shows that the decomposition temperature, the temperature corresponding to the transition point 110, of $SiH_4$ 102 is 900° C., the decomposition temperature for $SiH_2Cl_2$ 104 is 950° C., and the decomposition temperature of $SiCl_4$ 108 is 1150° C. FIG. 2b shows that the calculated Gibbs free energy curve for $SiCl_4$ 204 is greater than a calculated Gibbs free energy curve for $SiH_2Cl_2$ 206, which is greater than a calculated Gibbs free energy curve for $SiH_4$ 208. Thus, it is expected that Ge precursors will follow the same trends as the Si precursors and that Ge precursors that have a calculated Gibbs free energy curve that is greater than the calculated Gibbs free energy curve for $GeH_4$ will also have a greater decomposition temperature than $GeH_4$.

As shown in FIG. 2a, germane, $GeH_4$ 210, has the lowest Gibbs free energy of reaction indicating that it decomposes at the lowest temperature of all of the Ge precursors shown. $GeCl_4$ 212, $GeBr_4$ 214, $GeF_4$ 216, and $GeI_4$ 218 have much higher decomposition temperatures than $GeH_4$ 210. Thus, when high purity sources of these germanium halides are used as the Ge precursor, SiGe growth can occur with minimal reactor coating at temperatures above 600° C. In this way, the decomposition temperatures of precursors can be optimally chosen such that very high growth rates can be achieved at high temperatures. For example, selecting a Si precursor and a Ge precursor that both have a decomposition temperature above about 900° C. can minimize particle defect generation. If both selected Si and Ge precursor gases decompose at about the same high temperature then most of the free Si and Ge atoms should react and form epitaxial $Si_{1-x}Ge_x$ layers on the heated substrate. Otherwise, if the decomposition temperatures of the selected precursors are not within the same range, i.e. ±200° C., then the free atoms of the precursor that decomposes at a lower temperature will begin to rapidly deposit on surfaces, such as reactor walls and substrates, as particle defects prior to the decomposition of the other precursor.

FIG. 2c illustrates estimated decomposition temperatures for various Si precursors and Ge precursors. The most readily available germanium halide precursor is germanium tetrachloride, $GeCl_4$. This precursor, unlike germane, $GeH_4$, can be used at growth temperatures in excess of 800° C. to grow thick, relaxed $Si_{1-x}Ge_x$ layers without excessive reactor coating and particle defect formation. It can be combined with any of the Si precursors, such as $SiH_4$, $SiH_2Cl_2$, $SiHCl_3$, and $SiCl_4$ to form high quality SiGe layers. However, it is noted that in a preferred embodiment of the invention a combination of $SiH_2Cl_2$ and $GeCl_4$ is used, since the decomposition temperatures for these gases are within 25° C. of each other.

Figure 3:
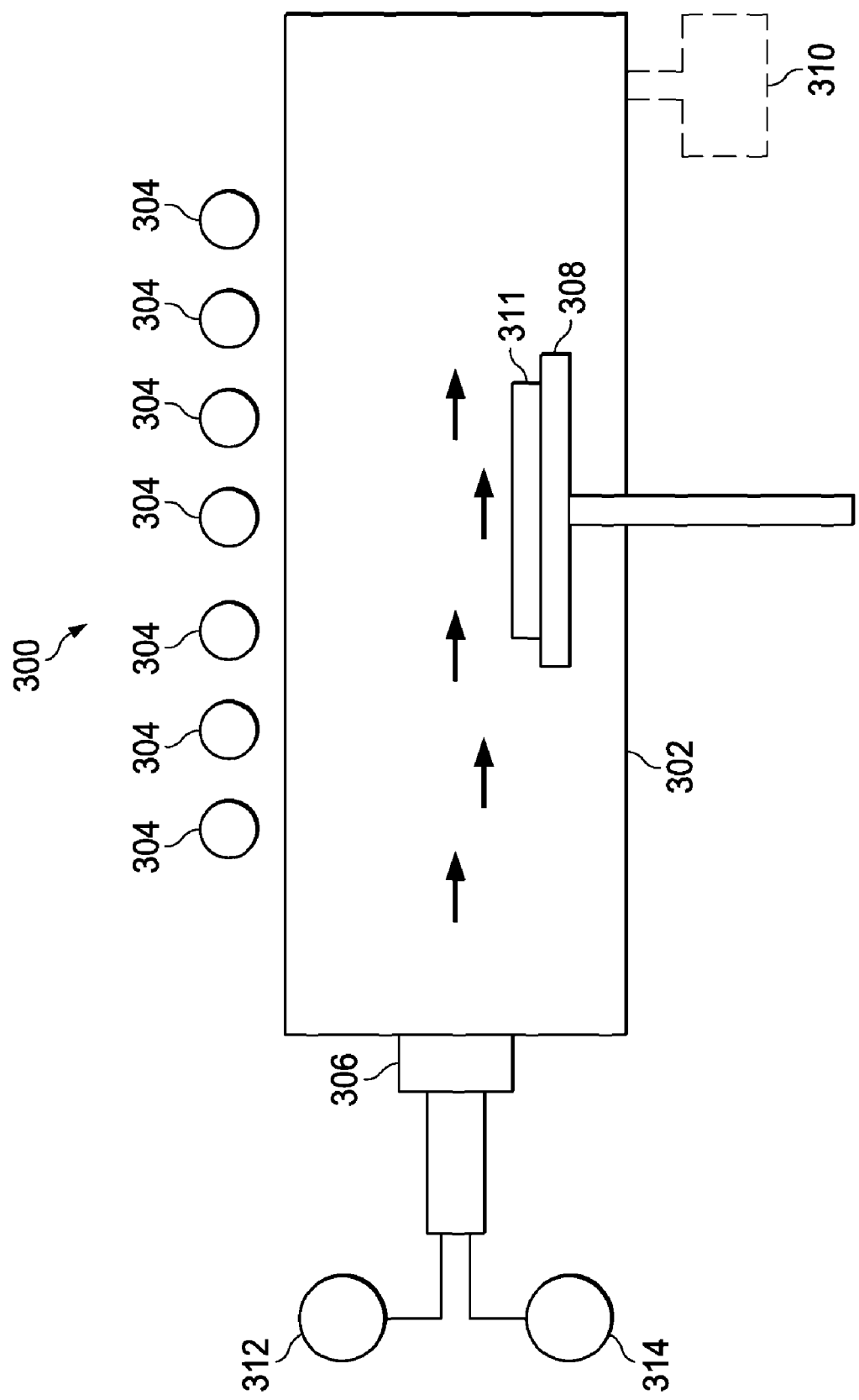
FIG. 3 shows a schematic view of one embodiment of a reactor used for producing relaxed SiGe layers in accordance with the present invention.

In the present invention, a CVD reactor 300, as shown in FIG. 3, is used to produce the relaxed SiGe layers on semiconductor substrates. The CVD reactor 300 includes a quartz tube 302, a heat source 304, a precursor gas inlet 306, a susceptor 308, and in some embodiments a vacuum pump 310 (shown in phantom view). To produce relaxed SiGe layers on a semiconductor material, a silicon substrate 311 is positioned on the susceptor 308. Next, the vacuum pump can be activated to continuously evacuate the gasses within the quartz tube 302 and to maintain a constant pressure (760 torr to 0.010 torr) within the reactor 300 during deposition. Then the heat source 304, which typically comprises multiple tungsten-halogen lamps, is activated so that the temperature of the Si substrate is increased to deposition temperature (600° C.-1200° C.). Once the Si substrate 311 has reached the specified deposition temperature, a Si precursor 312 and a Ge precursor 314 having a decomposition temperature greater than germane (e.g., a germanium halide precursor) enter the reactor 300 through the gas inlet 306. The concentration of the precursors is typically controlled through mass-flow controllers connected to the precursor tanks These precursors 312, 314 flow over the heated silicon substrate 311 and deposit thereon. A Ge content, x, of the $Si_{1-x}Ge_x$ layer is controlled by the relative concentration of the Si and Ge precursors. In some embodiments, a SiGe layer having a uniform content of Ge throughout is deposited on the silicon substrate. For example, a layer of material having a uniform concentration of $Si_{0.98}Ge_{0.02}$ can be deposited on the Si substrate 311. In other embodiments, multiple $Si_{1-x}Ge_x$ layers each having a successively greater Ge, x, content may be deposited on the silicon substrate to form a graded layer. Alternatively, the graded layer Ge content profile may be substantially linear (i.e. no individual layers are evident within the profile.) By increasing the Ge content gradually, the strain due to lattice mismatch between Si and Ge is relieved, thereby minimizing threading dislocation density in the deposited relaxed SiGe layer. Typically, the Ge content of the graded $Si_{1-x}Ge_x$ layer is increased at a rate of less than about 25% Ge per micron. However, in some embodiments the increase may be greater than 25% Ge per micron. In either embodiment, due to the high processing temperatures available in the present invention, the density of threading dislocation intersecting the top surface of the $Si_{1-x}Ge_x$ layer is less than about $1 \times 10^6/cm^2$.

For graded $Si_{1-x}Ge_x$ layers deposited using this method, a final Ge content, i.e. the Ge content of the final layer deposited, will exceed 15% and in some embodiments the final Ge content will exceed 20%. In other embodiments, the Ge content may approach 100%.

Figure 4:
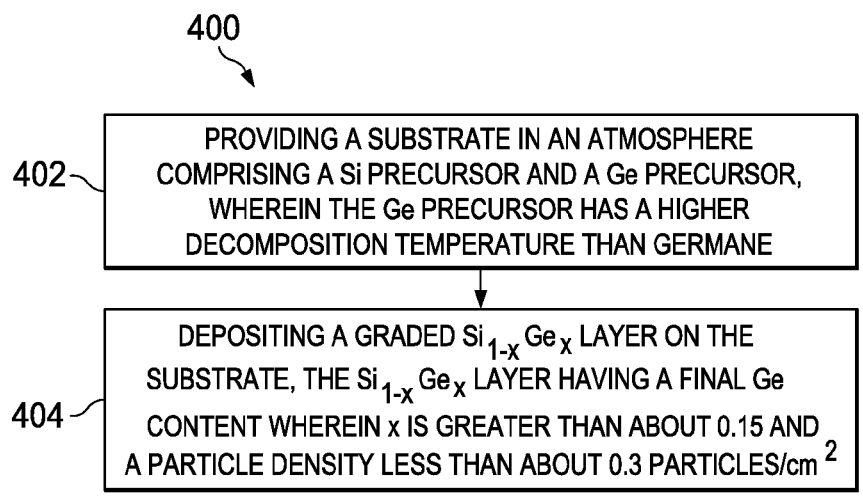
FIG. 4 shows a flow chart of an embodiment of a method for minimizing particle generation during deposition of a graded $Si_{1-x}Ge_x$ layer.

FIG. 4 shows a flow chart of one embodiment of the method of the invention. Specifically, a method 400 for minimizing particle generation particle generation during deposition of a graded $Si_{1-x}Ge_x$ layer on a semiconductor material within a reactor, such as the reactor 300 shown in FIG. 3, includes at least two steps. First, as shown in step 402, a substrate is placed within an atmosphere including both a Si precursor and a Ge precursor. The Ge precursor is any germanium source that has a decomposition temperature higher than that of germane. In general, germanium halides, such as, for example, $GeCl_4$, $GeHCl_3$, $GeH_2Cl_2$, $GeBr_4$, $GeI_4$, $GeF_4$, and $GeAt_4$, have a decomposition temperature higher than the decomposition temperature of germane. The Si precursor is typically selected from the group consisting of $SiHCl_3$, $SiH_2Cl_2$, $SiCl_4$, and $SiH_4$. However, any Si-based precursor that has a decomposition temperature above about 700° C. may be selected as a Si precursor, possibly including other silicon-halide compounds.

Next, as shown in step 404, a graded $Si_{1-x}Ge_x$ layer having a final Ge content of greater than about 15% (i.e. x>0.15) and a particle defect density less than about 0.3 particles/cm$^2$ is deposited on the substrate. The low particle defect density and high final Ge content of the $Si_{1-x}Ge_x$ layer results because the method 400 takes advantage of using a germanium halide for the Ge precursor and matching the decomposition temperature of the selected germanium halide to a particular Si precursor. For example, with reference to FIGS. 1 and 2, the graded $Si_{1-x}Ge_x$ layer may be deposited in reactor 300 using a combination of $SiH_4$ and $GeH_2Cl_2$ at a temperature above about 600° C., and more preferably at a temperature above about 800° C. At these temperatures, a low energy plasma can be used to aid the cracking of the precursors and to give higher growth rates at a lower temperature.

In another embodiment of the graded $Si_{1-x}Ge_x$ layer, the selected Si and Ge precursors are $SiH_2Cl_2$ and $GeCl_4$. In this embodiment, the deposition occurs at a temperature greater than about 1000° C., and preferably at a temperature between 1050° C. and 1100° C. The $SiH_2Cl_2$ is introduced into the reactor 300 at a constant flow rate of about 100 sccm or greater. The $GeCl_4$ is introduced into the reactor using a hydrogen carrier gas at an incremental flow rate increased from 0 to 250 sccm to produce a graded $Si_{1-x}Ge_x$ layer having a final Ge content of about 20%, i.e. x=0.2. In some embodiments the $GeCl_4$ is introduced into the reactor using a hydrogen carrier gas at an incremental flow rate increased from 0 to 350 sccm to produce a graded $Si_{1-x}Ge_x$ layer having a final Ge content of about 30%, i.e. x=0.3.

In another embodiment, the deposition process is performed at atmospheric pressure for the purpose of reducing reactor chamber wall deposits to a lower level. This is done to take advantage of the reduced tendency of the silicon and germanium precursors to decompose at higher pressure.

Figure 5A:
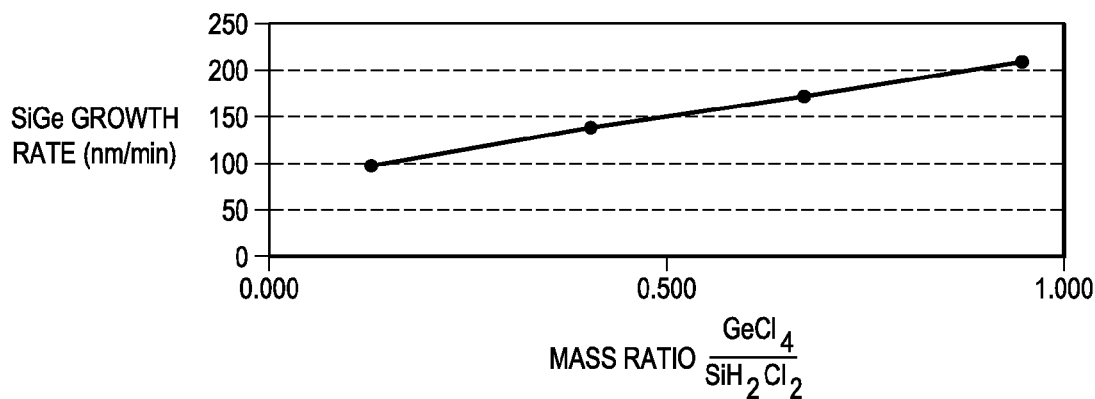
FIG. 5a shows a graph of growth rate of SiGe deposited in a research reactor versus mass ratio of $GeCl_4$ to $SiH_2Cl_2$ at 1000° C., 75 torr, and 100 sccm of $SiH_2Cl_2$.
Figure 5B:
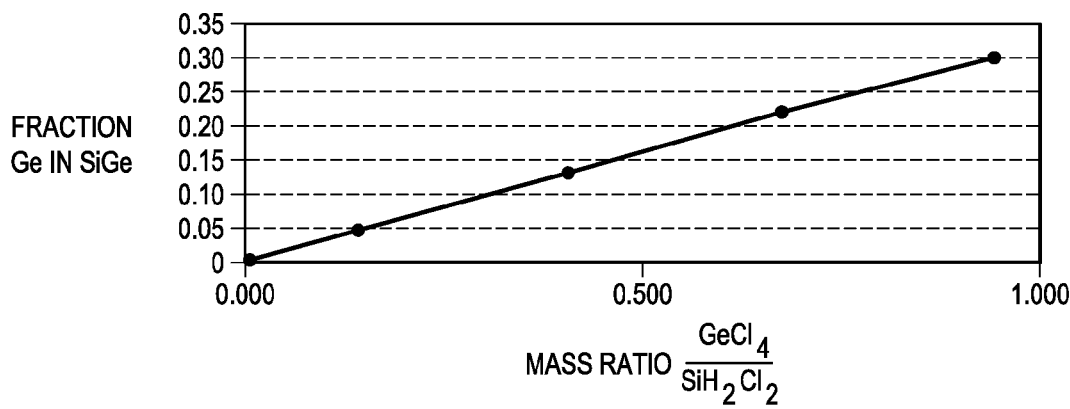
FIG. 5b shows a graph of atomic fraction of Ge in SiGe grown in the research reactor versus mass ratio of $GeCl_4$ to $SiH_2Cl_2$ at 1000° C., 75 torr, and 100 sccm of $SiH_2Cl_2$.

Referring to FIGS. 5a and 5b, experimentation in a research reactor system at 1000° C. and 75 torr, shows that the growth rate of the SiGe layer increases with increasing a mass ratio of $GeCl_4$ to $SiH_2Cl_2$ to a growth rate of about 0.25 microns/minute with a Ge atomic fraction of about 0.3. Since state of the art reactor systems typically achieve greater growth rates than research reactor systems, it is believed that deposition of SiGe layers from $SiH_2Cl_2$ and $GeCl_4$ at this temperature (1000° C.), pressure (75 torr) in a state of the art reactor system will be at a growth rate greater than 0.25 microns/minute.

Figure 6A:
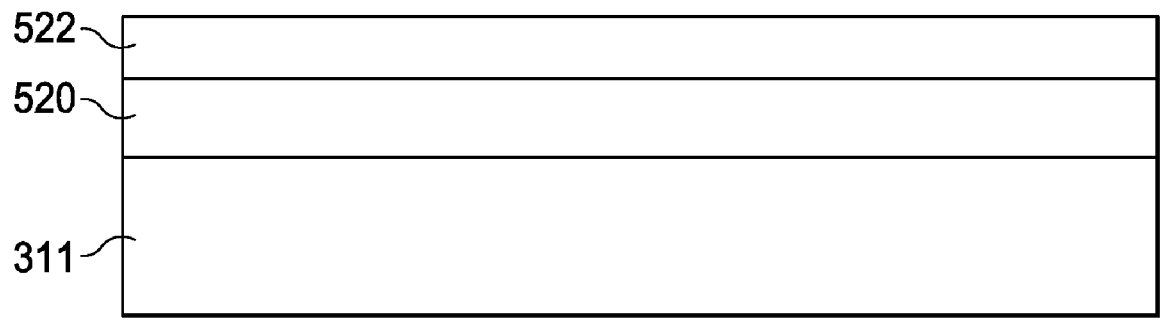
FIG. 6a shows a cross-sectional view of a substrate including a graded $Si_{1-x}Ge_x$ layer formed in accordance with the invention. Disposed on top of the graded $Si_{1-x}Ge_x$ layer is a relaxed SiGe cap layer.
Figure 6B:
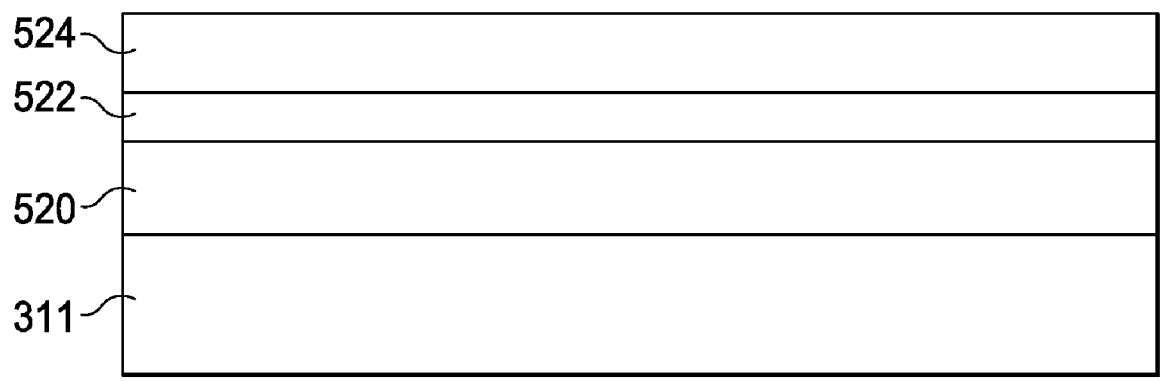
FIG. 6b shows a cross-sectional view of a substrate including a graded $Si_{1-x}Ge_x$ layer formed in accordance with the invention. Disposed on top of the graded $Si_{1-x}Ge_x$ layer is a relaxed SiGe layer, and a thin, strained semiconductor layer of Ge.

FIG. 6a shows a cross-sectional view of the silicon substrate 311 including a graded $Si_{1-x}Ge_x$ layer 520 formed in accordance with the invention. Disposed on top of the graded $Si_{1-x}Ge_x$ layer 520 is a substantially relaxed $Si_{1-y}Ge_y$ layer 522. The layer 522 shown in this embodiment has a Ge content, y, that is approximately equal to the final Ge content of the graded $Si_{1-x}Ge_x$ layer. Generally, the relaxed $Si_{1-x}Ge_x$ layers and the $Si_{1-y}Ge_y$ layers produced in accordance with the invention are smooth and have a surface roughness of less than 5 nm for a 40×40 micron atomic force microscopy scan. In an additional embodiment, shown in FIG. 6b, a thin, strained semiconductor 524 layer of Ge may be disposed above the substantially relaxed $Si_{1-y}Ge_y$ layer. Alternatively, this layer 524 may be formed from Si or SiGe.

The ability to deposit films at high temperatures using a germanium halide gas, such as $GeCl_4$, results in a lower particle defect density within the deposited relaxed $Si_{1-x}Ge_x$ layer than for $Si_{1-x}Ge_x$ layers formed at the same temperatures using conventional methods. For example, relaxed $Si_{1-x}Ge_x$ layers formed in accordance with the present invention and at a temperature of about 1000° C. have a particle defect level of less than about 0.3 particles/cm$^2$, whereas $Si_{1-x}Ge_x$ layers formed using conventional research techniques (i.e. $GeH_4$ gas used and a final Ge content below about 15%) have a particle defect density of 0.6 to 2 particles/cm$^2$, or higher. Further, relaxed $Si_{1-x}Ge_x$ layers produced in accordance with the present invention typically have a localized light-scattering defect level of less than about 0.3 defects/cm$^2$ for particle defects having a size (diameter) greater than 0.13 microns, a defect level of about 0.2 defects/cm$^2$ for particle defects having a size greater than 0.16 microns, a defect level of about 0.1 defects/cm$^2$ for particle defects having a size greater than 0.2 microns, and a defect level of about 0.03 defects/cm$^2$ for defects having a size greater than 1 micron. It is believed that process optimization will enable reduction of the localized light-scattering defect levels to about 0.09 defects/cm² for particle defects having a size greater than 0.09 microns and to 0.05 defects/cm² for particle defects having a size greater than 0.12 microns.

Figures 7, 8:
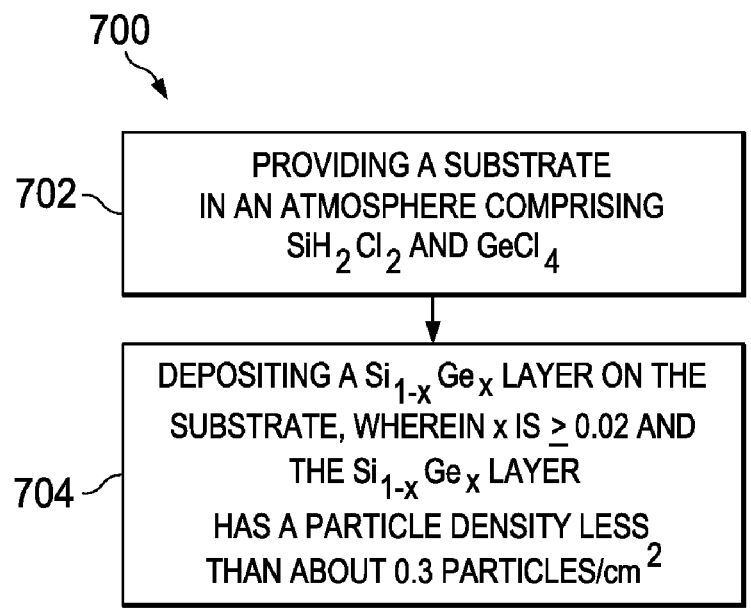
FIG. 7 shows a table of achievable Si growth rates and achievable $Si_{0.8}Ge_{0.2}$ growth rates when $GeCl_4$ is used for the Ge precursor.
FIG. 8 shows a flow chart of an embodiment of a method for minimizing particle generation during deposition of a semiconductor material.

Thus, by using a Ge precursor with a decomposition temperature higher than that of germane (e.g., a germanium halide precursor), $Si_{1-x}Ge_x$ layers may be produced at higher temperatures while maintaining a high quality level, i.e. particle defect density less than 0.3 particle defects/cm², even at high Ge contents, e.g., x>0.15. Moreover, since deposition can occur at temperatures above 1000° C., growth rates greater than 0.1 microns/minute are achievable. For example, FIG. 7 shows a table of achievable Si growth rates and corresponding estimated achievable $Si_{0.8}Ge_{0.2}$ growth rates for deposition processes using $GeCl_4$ and various silicon precursors. The estimated achievable SiGe growth rates are calculated using the lower value calculated from the following two equations, in which R is the growth rate and F is the atomic fraction:

$$R_{SiGe} \approx F_{Ge}*R_{Ge} + F_{Si}*R_{Si} \qquad \text{Equation 1}$$

$$R_{SiGe} \approx R_{Ge}/F_{Ge} \qquad \text{Equation 2}$$

Reported values of the growth rate for Si ($R_{Si}$) for various Si precursors is shown in the second column of FIG. 7. The growth rate ($R_{Ge}$) of $GeCl_4$ is estimated to be 0.75 microns/minute, a value based on a comparison of the decomposition temperature and resulting growth rates for $SiH_4$ and $SiH_2Cl_2$. As shown in FIG. 7, an achievable growth rate for the combination of $SiH_2Cl_2$ and $GeCl_4$ is 1.1 micron/minute and is 3.8 microns/minute for the combination of $SiHCl_3$ and $GeCl_4$. Both of these achievable growth rates allow production times to be drastically cut.

Production time in the present invention is further reduced due to the decrease in particles depositing and coating the reactor walls. Typically, once the coating on the reactor 300 reaches a thickness greater than 1 micron, the transmissivity of the quartz tube 302 will deteriorate quickly, resulting in an increase in temperature and ultimately in devitrification. To prevent contaminants from flaking off of the quartz tube 302 and landing on the depositing $Si_{1-x}Ge_x$ layers 520, the quartz tube 302 is cleaned to remove the coating once the coating reaches a thickness of 1 micron or more. Since the invention limits the amount of reactor coating by increasing the decomposition temperature of the Ge precursor (germanium halide) to near that of the Si precursor, the coating takes longer to grow on the walls, e.g., 175 hours of deposition time, and thus less time is lost to cleaning the quartz tube 302. An additional source of coating minimization may arise from etching action arising from the halogen component of the Ge precursor.

Because hydrogen-halide and halide gases etch silicon at a significantly higher rate than hydrogen, these gases (primarily HCl) are typically used to etch coatings from quartz reactor walls. In the same way, halogen-containing byproducts of the SiGe deposition will aid this etching action. Thus in another aspect of this invention, the etching reduces the accumulation of unwanted deposits on the quartz walls while deposition is being done in the reactor. This can occur because the halide etchant species (e.g., HCl produced from the decomposition of $GeCl_4$) is introduced as a byproduct of the decomposition of the silicon or germanium halide species. In another embodiment of this invention, the etchant gas (e.g., HCl, HBr, HF, or HI or a halide alone $Cl_2$, $Br_2$, $F_2$, or $I_2$) can be co-injected or introduced to reduce the accumulation of unwanted deposits on the reactor chamber walls, i.e., the quartz tube 302. For example, HCl can be co-injected into the reactor along with the Si and Ge precursors at a flow rate of less than or equal to 2 slm (standard liters per minute). In a preferred embodiment, HCl is co-injected into the reactor at a rate of less than or equal to 0.5 slm. Also, co-injection of the etchant gas can even be used to reduce reactor wall deposits when germane gas is used as the Ge precursor because the etchant gas, which includes a halide source, can reduce the accumulation of unwanted deposits at a higher rate than hydrogen. Co-injection can be more effective at introducing the etchant gas to the walls of the reactor than by introducing the etchant gas by reaction of the Si and Ge precursors, because delivery of the co-injected gases can be controlled. If the etchant gas is produced solely as a byproduct of deposition, it must diffuse from the susceptor 308 to the walls of the reactor 302 to etch the deposits. One helpful aspect of this process is that the Gibbs free energy of the etching reactions is much less temperature dependent than the deposition process so that the etch rate at the walls stays high even though the temperature at the wall is significantly lower than the temperature at the susceptor 308.

The invention can be further optimized to produce the highest quality relaxed $Si_{1-x}Ge_x$ layers. For example, in one embodiment, the susceptor 308 can be rotated during deposition to compensate for depletion of a precursor and to produce a uniform deposition of $Si_{1-x}Ge_x$ over the entire substrate 311.

Referring to FIG. 8, our invention also provides a method 700 for depositing a $Si_{1-x}Ge_x$ layer having a uniform Ge content and a low particle defect density. Specifically, method 700 includes two steps, 702 and 704. First, as according to step 702, a substrate is positioned within a reactor having an atmosphere of $SiH_2Cl_2$ and $GeCl_4$. Then, as shown in step 704, the $Si_{1-x}Ge_x$ layer is deposited on the substrate. The deposited $Si_{1-x}Ge_x$ layer has an x value of at least 0.02 and a particle defect density of less than about 0.3 particles/cm². The low particle defect density observed in $Si_{1-x}Ge_x$ layers deposited using method 700 is a result of using Si and Ge precursors that have a decomposition temperatures above about 700° C. and that are optimally matched, i.e. have a decomposition temperatures within ±25° C. of each other.

Using method 700, a uniform $Si_{1-x}Ge_x$ layer having a particle defect density of less than 0.3 particles/cm² can be deposited on substrates. For example, a $Si_{0.98}Ge_{0.02}$ layer may be formed on a Si wafer by introducing $SiH_2Cl_2$ gas into reactor 300 at a flow rate of about 100 sccm and $GeCl_4$ gas within a hydrogen carrier gas at a constant flow rate of 25 sccm. The $Si_{0.98}Ge_{0.02}$ layer deposits at a temperature above about 600° C., and preferably at a temperature of 1100° C.

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A method of producing a silicon germanium layer, the method comprising:
   heating a silicon substrate to a deposition temperature, the silicon substrate being in a process atmosphere;
   introducing into the process atmosphere a silicon precursor and a germanium precursor, the germanium precursor having a decomposition temperature that is higher than germane; and
   forming silicon from the silicon precursor and germanium from the germanium precursor on the silicon substrate at the deposition temperature to form a film on the silicon substrate, the film comprising $Si_{1-x}Ge_x$, the film having a final Ge content where x is greater than 0.15, and the film including a particle defect density less than about 0.3 particles/cm².

2. The method of claim 1, wherein a concentration of the silicon precursor and a concentration of the germanium precursor each remain constant while being introduced into the process atmosphere, and wherein the film has a uniform Ge content.

3. The method of claim 1, wherein at least one of a concentration of the silicon precursor and a concentration of the germanium precursor is increased while being introduced into the process atmosphere, and wherein the film is a graded film.

4. The method of claim 3, wherein the concentration of the germanium precursor is increased.

5. The method of claim 3, wherein the at least one of the concentration of the silicon precursor and the concentration of the germanium precursor is increased linearly while being introduced into the process atmosphere, and wherein the graded film has a linear grade.

6. The method of claim 3, wherein the at least one of the concentration of the silicon precursor and the concentration of the germanium precursor is increased discretely while being introduced into the process atmosphere, and wherein the graded film has a step grade.

7. The method of claim 1, wherein the germanium precursor comprises at least one of $GeCl_4$, $GeHCl_3$, $GeH_2Cl_2$, $GeBr_4$, $GeI_4$, $GeF_4$, and $GeAt_4$.

8. The method of claim 1, wherein the silicon precursor comprises at least one of $SiHCl_3$, $SiH_2Cl_2$, $SiCl_4$, and $SiH_4$.

9. A method for semiconductor processing, the method comprising:
heating a silicon substrate to a deposition temperature greater than 1000 degrees Celsius;
providing a silicon precursor and a germanium halide precursor to the silicon substrate while at the deposition temperature; and
forming an $Si_{1-x}Ge_x$ film on the silicon substrate using the silicon precursor and the germanium halide precursor, the forming the $Si_{1-x}Ge_x$ film comprising a growth rate of greater than 0.1 microns/minute, wherein the $Si_{1-x}Ge_x$ film comprises a value of x greater than 0.15.

10. The method of claim 9, wherein the germanium precursor comprises at least one of $GeCl_4$, $GeHCl_3$, $GeH_2Cl_2$, $GeBr_4$, $GeI_4$, $GeF_4$, and $GeAt_4$.

11. The method of claim 9, wherein the $Si_{1-x}Ge_x$ film comprises a particle defect density of less than 0.3 particles/cm².

12. The method of claim 9 further comprising providing a pressure of at least 75 torr to the silicon substrate during the providing the silicon precursor and the germanium halide precursor to the silicon substrate.

13. The method of claim 9 further comprising forming a hydrogen halide from a byproduct of the silicon precursor and a byproduct of the germanium halide precursor.

14. The method of claim 9 further comprising providing an etchant gas simultaneously with the providing the silicon precursor and the germanium halide precursor.

15. A method for semiconductor processing, the method comprising:
introducing a silicon precursor and a germanium precursor to a silicon substrate at a deposition temperature, a decomposition temperature of the silicon precursor being within 25 degrees Celsius of a decomposition temperature of the germanium precursor, the deposition temperature being greater than the decomposition temperatures of the silicon precursor and the germanium precursor; and
forming a film on the silicon substrate using the silicon precursor and the germanium precursor, the film comprising a final content of germanium that is greater than 15 percent.

16. The method of claim 15, wherein the film comprises a particle defect density of less than 0.3 particles/cm².

17. The method of claim 15, wherein the film comprises a threading dislocation density less than $1 \times 10^6$/cm².

18. The method of claim 15, wherein the final content of germanium is greater than 20 percent.

19. The method of claim 15 further comprising maintaining the silicon substrate in an atmosphere with atmospheric pressure during the introducing the silicon precursor and the germanium precursor to the silicon substrate.

20. The method of claim 15, wherein the film is graded.

* * * * *